United States Patent [19]
Yoshihara

[11] Patent Number: 6,066,418
[45] Date of Patent: May 23, 2000

[54] X-RAY MASK AND FABRICATION PROCESS THEREFOR

[75] Inventor: Takuya Yoshihara, Tokyo, Japan

[73] Assignee: NEC Corporation, Tokyo, Japan

[21] Appl. No.: 08/890,978

[22] Filed: Jul. 10, 1997

[30] Foreign Application Priority Data

Jul. 10, 1996 [JP] Japan ................................. 8-180287

[51] Int. Cl.$^7$ .............................. G03F 9/00; B32B 19/00
[52] U.S. Cl. .............................. 430/5; 428/697; 428/698; 428/699; 428/701; 378/34; 378/35; 430/324
[58] Field of Search .................................. 428/688, 689, 428/697, 701, 698; 430/5, 323, 324; 378/34, 35

[56] References Cited

U.S. PATENT DOCUMENTS

| | | | |
|---|---|---|---|
| 4,515,876 | 5/1985 | Yoshihara et al. | 430/5 |
| 4,592,081 | 5/1986 | Eaton et al. | 378/34 |
| 5,101,420 | 3/1992 | Kushibiki et al. | 378/35 |
| 5,166,962 | 11/1992 | Murooka et al. | 378/34 |
| 5,188,706 | 2/1993 | Hori et al. | 156/643 |
| 5,196,283 | 3/1993 | Ikeda et al. | 430/5 |
| 5,291,536 | 3/1994 | Itoh et al. | 378/35 |
| 5,496,667 | 3/1996 | Yabe et al. | 430/5 |
| 5,541,023 | 7/1996 | Kondo et al. | 430/5 |
| 5,553,110 | 9/1996 | Sentoku et la. | 378/35 |

FOREIGN PATENT DOCUMENTS

| | | |
|---|---|---|
| 61-292919 | 12/1986 | Japan . |
| 63-232425 | 9/1988 | Japan . |
| 2-2109 | 1/1990 | Japan . |
| 2-94421 | 4/1990 | Japan . |
| 2-123730 | 5/1990 | Japan . |
| 3-116716 | 5/1991 | Japan . |
| 3-173116 | 7/1991 | Japan . |
| 4-10616 | 1/1992 | Japan . |
| 5-299326 | 11/1993 | Japan . |

OTHER PUBLICATIONS

Sugawara, Minoru et al., "Stress–free and amorphous $Ta_4B$ or $Ta_8SiB$ absorbers for x–ray masks", *J. Vac. Sci. Technol. B,* 7(6), Nov./Dec. 1989, American Vacuum Society, pp. 1561–1564.

Yoshihara, Takuya et al., "Variation of internal stresses in sputtered Ta films", *J. Vac. Sci. Technol. B,* 11(2), Mar./Apr. 1993, American Vacuum Society, pp. 301–303.

Yabe, Hideki et al., "Sputtered W–Ti Film for X–Ray Mask Absorber", *Jpn. J. Appl. Phys.,* vol. 31 (1992) pp. 4210–4214, Part 1, No. 12B, Dec. 1992.

*Primary Examiner*—Timothy Speer
*Assistant Examiner*—Stephen Stein
*Attorney, Agent, or Firm*—Hutchins, Wheeler & Dittmar

[57] ABSTRACT

On a support frame of Si, an X-ray transmissive layer of SiC or so forth is formed. On the X-ray transmissive film, a predetermined pattern of X-ray absorber of an oxide, such as TaO or so forth is formed.

32 Claims, 6 Drawing Sheets

X-RAY MASK AND FABRICATION PROCESS THEREFOR

BACKGROUND OF THE INVENTION

1. Field of the Invention

The present invention relates to an X-ray mask, in which an X-ray absorber is selectively formed on an X-ray transmissive layer, and a fabrication process therefor.

2. Description of the Related Art

Conventionally, an X-ray mask has a configuration, in which an X-ray absorber is formed into a predetermined pattern on an X-ray transmissive layer. FIG. 1 shows the conventional X-ray mask. On the upper surface and lower surface of a support frame 12 made of Si, an X-ray transmissive layers 13 and 14 made of SiC or SiN are formed. On the X-ray transmissive layer 13 on the upper surface of the support frame 12, an X-ray absorber 15a which is made of W or Ta is formed in a device pattern. As the X-ray absorber, WTiN is disclosed in Jpn. J. Appl. Phys. 31 (1992) pp. 4210–4214 (H. Yabe, et al.). Also, $Ta_4B$ is disclosed in J. Vac. Sci. Technol. B7(6), 1989, pp 1561–1564 (M. Sugawara, et al.). An alloy of Ta, Al, Ti, Si and Mo is disclosed in Japanese Unexamined Patent Publication (Kokai) No. Heisei 2-2109.

One example of the fabrication process of such X-ray mask is illustrated in FIGS. 2A to 2D. At first, as shown in FIG. 2A, on upper and lower surfaces of a Si substrate 12a, SiC layers 13 and 14 are formed. Also, as shown in FIG. 2B, an X-ray absorbing layer 15 is deposited by way of sputtering method on the upper surface of Si substrate 12a. Also, over the X-ray absorbing layer 15, a photoresist mask 16 is formed by applying an photoresist on the X-ray absorbing layer 15 and subjecting the photoresist with exposure in a desired pattern and development.

Then, as shown in FIG. 2C, using the photoresist mask 16, the X-ray absorbing layer 15 is etched into a predetermined pattern to form an X-ray absorber 15a.

Thereafter, as shown in FIG. 2D, the lower surface of the Si substrate 12a is subject to an anisotropic etching to form the support frame 12.

It should be noted that, in such X-ray mask, it has been required to have long period stability in the X-ray absorber. Therefore, as shown in FIG. 2D, the surface of the X-ray absorber 15a is oxidized to cover with an oxide layer 17 (for example, Japanese Unexamined Patent Publication No. Heisei 3-173116, Japanese Unexamined Patent Publication No. Heisei 3-116716, Japanese Unexamined Patent Publication No. Showa 61-292919).

In such prior art X-ray absorber is made of a metal. Therefore, for certainly stabilizing the X-ray absorber, oxidation of the surface is performed. However, a volume of the X-ray absorber causes expansion to vary the internal stress of the X-ray absorber by the oxidation. For example, in case of Ta, oxidation propagates in the depth up to 10 to 20 nm for a several tens minutes after deposition. When the thickness of the X-ray absorber is 0.5 μm, internal stress of the X-ray absorber is compression stress of 10 to 20 MPa (J. Vac. Sci. Technol. B11(2), (1993) pp 301–303 (Y. Yoshihara and K. Suzuki). Therefore, due to the internal stress, the pattern dimension and position of the X-ray absorber should be changed to cause error and reduce patterning accuracy.

For such problem, even if a control for reducing the stress is done during process for forming the layer of the X-ray absorber, upon patterning of the X-ray absorber, new surface of the X-ray absorber should be exposed at the etched portion to cause oxidation in such exposed portion. Therefore, it has been difficult to reduce stress. Particularly, if the pattern is finer, the exposed area is larger to make influence of stress due to oxidation more significant. Also, once stress is caused, even if adjustment is attempted by annealing, ion implantation and so forth in the subsequent step, stress distribution associating with pattern size and/or pattern density has bear caused. Therefor, it is difficult to reduce stress over the entire area of the X-ray absorber.

In addition, upon formation of the resist pattern (resist mask) for forming the X-ray absorber pattern by way of electron beam drawing method, there has been proposed a technology for correcting the pattern drawing in consideration of strain of the pattern which may be produced during the process (No. 43th Applied Physics Relating Lecture Meeting Preliminary Report, 27p-zp-9). However, even with such technology, strain of the pattern cannot be solved completely.

Furthermore, there has been proposed to prevent the X-ray absorber from being exposed to the ambient air and, at least to prevent oxidation after patterning, by forming anti-oxidation layer on the X-ray absorber. However, such coat layer should influence for permeability and reflection of X-ray to lower contrast of the line exposure to reduce alignment accuracy.

SUMMARY OF THE INVENTION

It is an object of the present invention to provide an X-ray mask which can avoid lowering of pattern accuracy by oxidation of an X-ray absorber to achieve high pattern accuracy, and a fabrication process therefor.

An aspect of an X-ray mask, according to the present invention comprises an X-ray absorber selectively formed on an X-ray transmissive film. Said X-ray absorber is formed of an oxide. Particularly, the X-ray absorber may be entirely formed of oxide. For example, as oxide forming the X-ray absorber, oxide of Ta, W, Re, TaW alloy, WRe alloy, TaRe alloy, Ta nitride, W nitride, Re nitride, alloy of Ta, Re or W and Re, Si or Ti may be used.

A first aspect of a fabrication process of an X-ray mask, according to the present invention, comprises the steps of:

forming an X-ray transmissive film at least on the front surface of a substrate;

bonding said substrate on a support frame body at the peripheral portion of the back surface of said substrate;

etching the back surface of the substrate with leaving the peripheral portion un-etched;

forming an X-ray absorbing layer of an oxide on said X-ray transmissive layer; and forming an X-ray absorber by patterning said X-ray absorbing layer by way of a lithographic technology.

A second aspect of a fabrication process of an X-ray mask, according to the present invention, comprises the steps of:

forming an X-ray transmissive film at least on the front surface of a substrate;

forming an X-ray absorbing layer of oxide on said X-ray transmissive film;

forming an X-ray absorber by patterning said X-ray absorbing layer by way of a lithographic technology;

bonding said substrate on a support frame body at the peripheral portion of back surface of said substrate; and etching the back surface of said substrate with leaving the peripheral portion un-etched.

As means for selectively forming a pattern of said X-ray absorber is performed with employing a photolithography method, an electron beam drawing exposure method (EB exposure method) or a focused ion beams exposure method (FIB exposure method) may be employed.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to be present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessary obscure the present invention.

Figure 1:
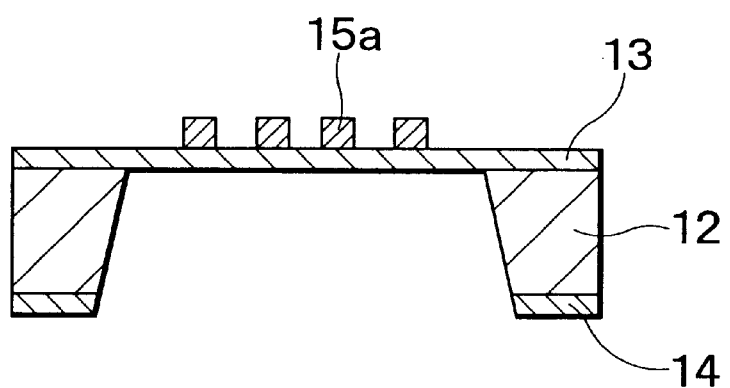
FIG. 1 is a section showing one example of the conventional X-ray mask.
Figure 2A:
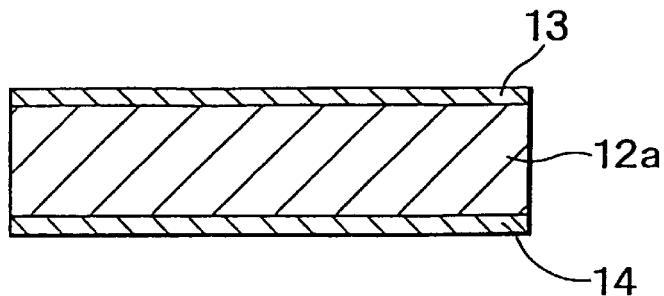
FIGS. 2A to 2D are sections showing one example of the conventional X-ray mask fabrication process illustrating process steps in sequential order.
Figure 2B:
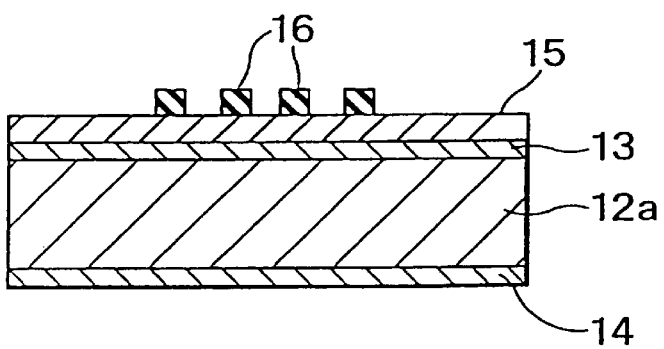
Figure 2C:
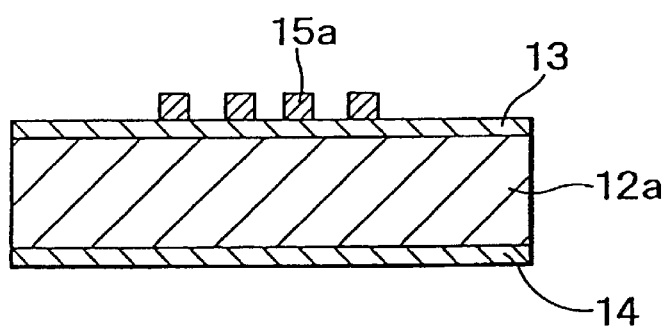
Figure 2D:
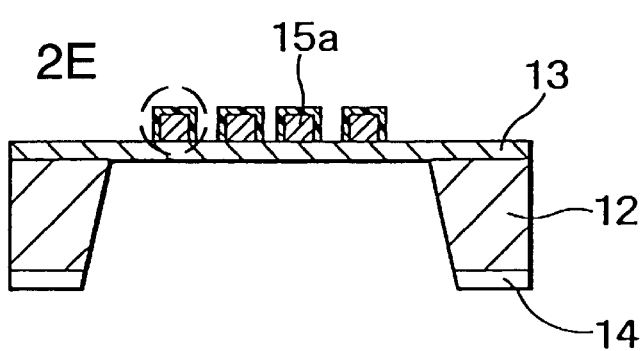
Figure 2E:
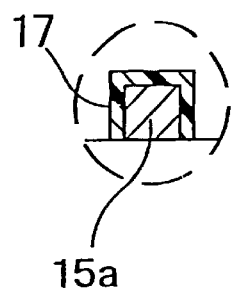
Figure 3:
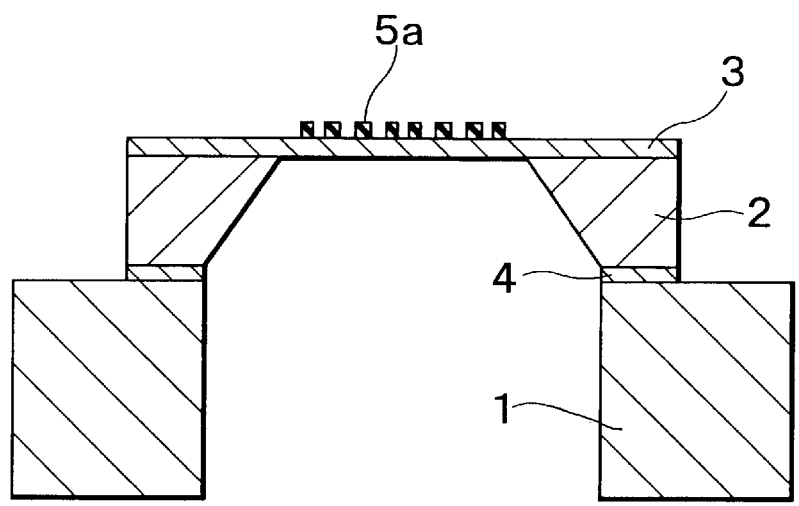
FIG. 3 is a section of one embodiment of an X-ray mask according to the present invention.

FIG. 3 is a section showing a configuration of the preferred embodiment of an X-ray mask according to the present invention. On a support frame body 1 of SiC or quartz glass, a support frame 2 obtained through etching process of a Si substrate is provided by bonding the back surface of the support frame 2 to the support frame body 1 with epoxy resin (not shown). On the front surface and back surface of the support frame 2, X-ray transmissive films 3 and 4, which is made of SiC, are formed. The film 4 on the back surface of the support frame 2 is patterned by etching together with the support frame 2, whereas the film 3 on the front surface of the support frame 2 is remained over the entire surface. On the film 3 where Si substrate is removed, a mask pattern consisted of an x-ray absorber 5a is formed. Here, the X-ray absorber 5a is formed of an oxide, such as TaO containing Ta: O=1:1.3. Also, oxide of Ta, W or Re, oxide of alloy of TaW, WRe or TaRe, oxide of nitride of Ta, W or Re, or oxide of alloy of Ta, Re or W and Ge, Si or Ti, respectively, may be used. Heavy metal, such as Ta, W, Re and the like have high X-ray absorbing coefficient and thus are suitable as the X-ray absorber. On the other hand, since the alloy of Ta, W or Re and Si or Ge and their compound are amorphous structure to have high stress controllability and fine processing ability in layer formation.

By forming the X-ray absorber 5a with the oxide, the X-ray absorber 5a may not be oxidized at all before and after formation of the mask pattern of the X-ray absorber, or upon actual use. Therefore, foregoing stress variation in the X-ray absorber 5a due to formation of the oxide layer will never be caused. Thus, the X-ray mask having high pattern accuracy, such as pattern position and pattern dimension, can be obtained. On the other hand, this X-ray absorber 5a is stable without being oxidized even through the high temperature process or under oxygen plasma to provide large margin for the process.

Figure 4A:
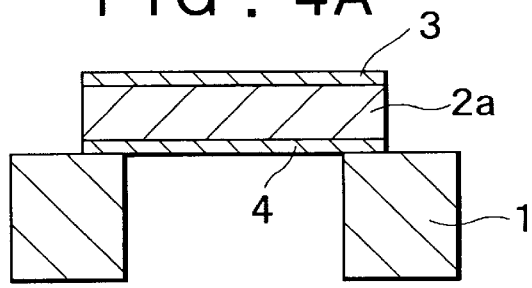
FIGS. 4A to 4D are sections showing first embodiment of an X-ray mask fabrication process according to the present invention.

FIGS. 4A to 4D are sections showing the first embodiment of a fabrication process of the X-ray mask as set forth above. At first, as shown in FIG. 4A, on both surfaces of the Si substrate 2a of 1 to 2 mm thick, SiC is deposited in a thickness of 1 to 2 $\mu$m by way of chemical vapor deposition (CVD) method to form the X-ray transmissive films 3 and 4. A portion of the film 4 where X-ray can passes is selectively removed by way of dry etching with $CF_4$. Subsequently, with taking the film 4 on the back surface of the substrate 2a as a mask, the back surface of the Si substrate 2a is selectively etched for removing the portion of the substrate 2a to pass the X-ray by anisotropic etching with KOH. Thereby, a support frame 2 is formed.

Figure 4B:
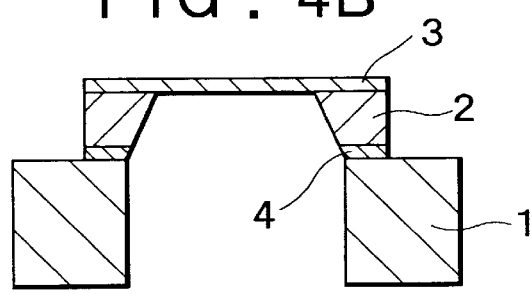

As shown in FIG. 4B, the back surface of the support frame 2 (the back surface of the peripheral edge portion of the Si substrate 2a) is bonded on the support frame body 1 of SiC having a thickness of about 5 mm and a quadrangular shape by epoxy resin. Thus, a support frame 2 is obtained from the Si substrate 2a by leaving only the frame form peripheral portion. In the region surrounded by the support frame 2, only film 3 on the front surface is maintained.

Figure 4C:
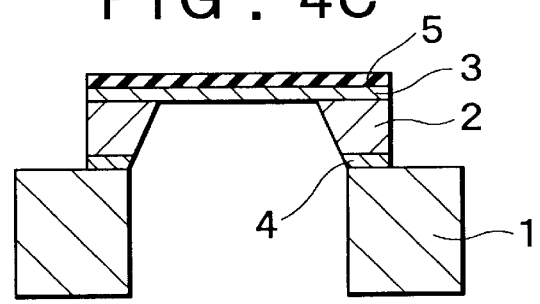
Figure 4D:
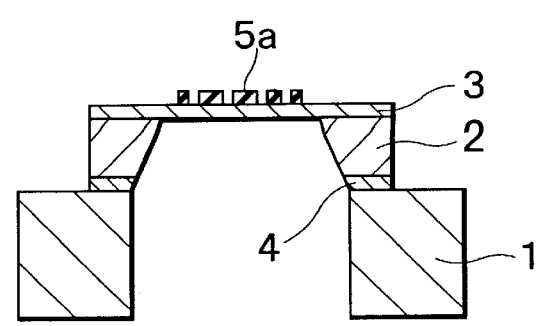

Thereafter, as shown in FIG. 4C, on the film 3 on the front surface of the support frame 2, the X-ray absorbing layer 5, which is consisted of the oxide, is deposited by way of sputtering method. As the X-ray absorbing layer 5, TaO is used, for example. For example, within a sputtering chamber containing TaO as a target, Xe gas is introduced in a flow rate of 100 sccm to maintain the pressure in the chamber at 0.5 Pa, and then 1 kW of electric power is applied to the target. Thereby low stress TaO layer is formed.

Figure 6:
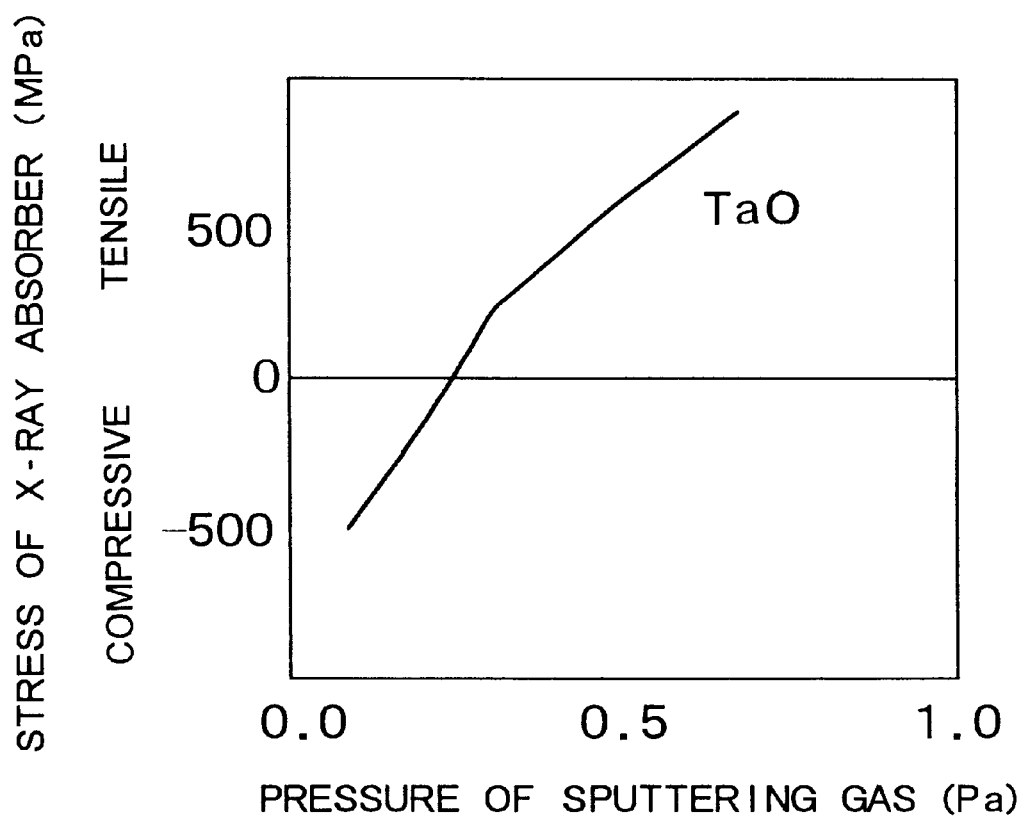
FIG. 6 is a graph showing a relationship between a sputtering gas pressure and stress of X-ray absorber.

FIG. 6 is a graph showing a relationship between the pressure of the sputtering gas on the horizontal axis and a stress of the X-ray absorber on the vertical axis. As shown in FIG. 6, when the pressure of the sputtering gas is varied, the stress of the TaO layer (X-ray absorbing layer 5) is varied significantly. When Ar is employed as the sputtering gas, similar layer may be formed. However, since Xe has greater radius of atom than Ar, the amount of gas to be introduced into the layer becomes small to obtain the layer having high stress controllability, stability and density of the X-ray absorbing layer 5. Also, since the temperature of the film 3 is elevated during deposition. Cooling is performed by filling the back surface of the film 3 with He gas, the temperature gradient between the film 3 and the Si substrate 2 becomes small and in-board distribution of the internal stress of the X-ray absorbing layer 5 becomes uniform.

Thereafter, while neglected from illustration, the photoresist is applied on the X-ray absorbing layer 5 in the similar manner to that of the conventional process. The photoresist is then patterned into desired pattern to form the photoresist mask. Then, using the photoresist as a mask, the X-ray absorbing layer 5 is etched by an etching gas of $SF_6$ or $Cl_2$ to form the desired pattern of the X-ray absorber 5a. Thus, the X-ray mask is completed. It should be noted that while the X-ray absorbing layer consisted of the oxide is deposited in a method, in which the oxide target is sputtered by the inert gas, it is possible to form in a reactive sputtering method, in which the target of metal or alloy, such as Ta or the like, is sputtered by the oxidation gas, such as oxygen, or in a CVD method.

Figure 5A:
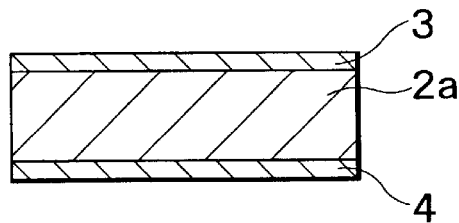
FIGS. 5A to 5D are sections showing second embodiment of an X-ray mask fabrication process according to the present invention.

FIGS. 5A to 5D are sections showing the second embodiment of the fabrication process of the X-ray mask according to the present invention. At first, as shown in FIG. 5A, on both surfaces of the Si substrate 2a in a thickness of 1 to 2 mm, SiC is deposited in a thickness of 1 to 2 μm to form the X-ray transmissive films 3 and 4 by way of CVD method.

Figure 5B:
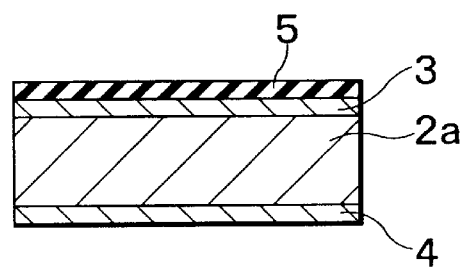

Next, as shown in FIG. 5B, the X-ray absorbing film 5 of oxide is deposited on the film 3 on the front surface of the substrate 2a by way of sputtering method. As the X-ray absorbing layer 5, TaO is used similarly to the former embodiment. It should be noted that, in the shown process, since the back surface of the Si substrate 2a is not etched out by anisotropic etching, it becomes possible to effect temperature control for the Si substrate 2a by tightly fitting the back surface of the Si substrate 2a on a wafer stage (not shown) to transfer the heat to the wafer stage by heat conduction. Therefore, it becomes unnecessary to cool the back surface of the Si substrate 2a by filling with gas, such as He or the like, as in the first embodiment of the fabrication process.

Next, while it is neglected from illustration, on the X-ray absorbing layer 5, the photoresist is applied in the similar manner to that of the first embodiment of the fabrication process set forth above. Also, the photoresist is patterned into desired pattern.

Figure 5C:
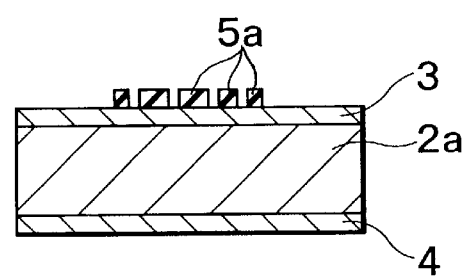

Thereafter, with taking the photoresist as a mask, the X-ray absorbing layer 5 is selectively etched by an etching gas of $SF_6$ or $Cl_2$ to form the desired pattern of the X-ray absorber 5a as shown in FIG. 5C to form the mask pattern.

Figure 5D:
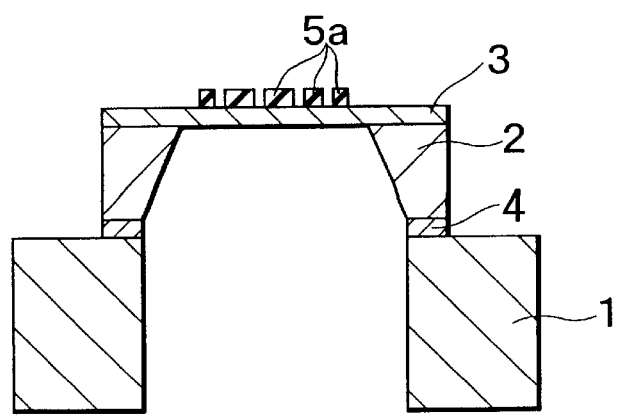

Subsequently, as shown in FIG. 5D, the film 4 on the back surface of the substrate 2a is selectively removed for the X-ray passing portion. Thereafter, anisotropic etching with KOH is performed for Si substrate 2a to selectively remove Si substrate 2a in the portion other than the peripheral portion. Thus, the film 4 on the back surface and the Si substrate 2a are formed into frame form consisting of the maintained peripheral portion thereof to form a support frame 2. Then, the back surface of the support frame 2 (the back surface of the Si substrate) is bonded onto the support frame body 1 of SiC, which is of quadrangular shape in a thickness of about 5 mm. By this, the X-ray mask is completed.

Next, discussion will be given for third embodiment of the fabrication process of the X-ray mask according to the present invention. In this method, in the process step of forming the photoresist pattern in the first embodiment of the fabrication process, an EB resist is applied in place of the photoresist. Then, by EB exposure, a desired pattern is formed to thus obtain fine resist pattern less than or equal to 0.1 μm. Using the EB resist as a mask, the X-ray absorber is selectively etched with the etching gas of $SF_6$ or $Cl_2$ to obtain the X-ray absorber pattern. Subsequently, through the similar process to those of the first embodiment of the fabrication process, the X-ray mask is completed.

Next, discussion will be given for the fourth embodiment of the fabrication process of the X-ray mask according to the invention. In this method, in the process step of forming the photoresist pattern in the first embodiment of the fabrication process, an EB resist is applied in place of the photoresist. Then, by FIB exposure, a desired pattern is formed to thus obtain fine resist pattern less than or equal to 0.1 μm. Using the EB resist as a mask, the X-ray absorber is selectively etched with the etching gas of $SF_6$ or $Cl_2$ to obtain the X-ray absorber pattern. In the FIB exposure method, mask-less process is possible. Within the FIB exposure chamber, the etching gas of $SF_6$ or $Cl_2$ is introduced upon to about 10 mTorr of pressure. Under gas atmosphere, FIB is irradiated onto the X-ray absorber to selectively etch the portion where the FIB is irradiated to form the X-ray absorber pattern without employing a mask. Subsequently, through the similar process to those of the first embodiment of the fabrication process, the X-ray mask is completed.

Next, discussion will be given for the fifth embodiment of the fabrication process of the X-ray mask according to the present invention. In the step of boding the support frame body 1 of quadrangular frame form having thickness of about 5 mm to the back surface of the Si substrate 2a, bonding is performed by cathode welding, by direct welding or by bonding with low melting point metal, such as Au—Si or the like. Subsequently, through the similar process to those of the first embodiment of the fabrication process, the X-ray mask is completed.

Next, discussion will be given for the sixth embodiment of the fabrication process of the X-ray mask according to the present invention. In the step of depositing the X-ray absorbing layer in the first embodiment of the fabrication process, two or more oxides are formed in multi-layer. When the multi-layer film is formed by combining oxides having mutually different stress, the stress of the multi-layer can be controlled freely. For example, when the X-ray absorber consisted of Tao and TaGeO is to be formed, Xe gas in introduced into the sputtering chamber containing target of TaO and TaGeO. A flow rate of Xe gas is 100 sccm to maintain the pressure of the chamber at about 0.5 Pa to alternatively stack TaO and TaGe over ten layers. Thus, low stress multi-layer film can be formed. Subsequently, through the similar process to those of the first embodiment of the fabrication process, the X-ray mask is completed.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out but to include all possible embodiments which can be embodied within a scope encompassed and equivalents thereof with respect to the feature set out in the appended claims.

What is claimed is:

1. An X-ray mask comprising:

an X-ray transmissive film; and an X-ray absorber selectively formed on said X-ray transmissive film, said X-ray absorber being formed entirely of at least one of: an oxide and a nitride, wherein the oxide forming said X-ray absorber is an oxide of the material selected from the group consisting of Ta, W, Re, TaW alloy, WRe alloy, TaRe alloy, alloy of Ta and Ge, Si or Ti, alloy of Re and Ge, Si or Ti and alloy of W and Ge, Si or Ti, and wherein said X-ray absorber is a multi-layer film of a plurality of oxides.

2. An X-ray mask comprising:

X-ray transmissive means for allowing transmission of X-rays therethrough; and

X-ray absorbing means, selectively etched on said X-ray transmissive means, for absorbing X-rays at portions thereof that remain after etching, said X-ray absorbing means being formed entirely of at least one of: an oxide and a nitride wherein said X-ray absorbing means includes an oxide of a material selected from the group consisting of Ta, W, Re, TaW alloy, WRe alloy, TaRe alloy, alloy of Ta and Ge, Si or Ti, alloy of Re and Ge, Si or Ti and alloy of W and Ge, Si or Ti.

3. An X-ray mask, according to claim 2, wherein said X-ray absorbing means includes at least two oxides that are alternatively layered.

4. An X-ray mask according to claim 2, further comprising:

substrate means for providing a surface for forming said X-ray transmissive means.

5. An X-ray mask, according to claim 4, further comprising:
support frame means corresponding to peripheral portions of said substrate means.

6. An X-ray mask, according to claim 5, further comprising:
bonding means for attaching said support frame means to said substrate means.

7. An X-ray mask comprising:
an X-ray transmissive film; and
an X-ray absorber selectively formed on said X-ray transmissive film, said X-ray absorber being formed entirely of an oxide.

8. A method of fabricating an X-ray mask, comprising:
forming a first X-ray transmissive film on a first surface of a substrate;
forming an X-ray absorbing layer entirely of oxide on said X-ray transmissive film; and
etching said X-ray absorbing layer to form a patterned X-ray absorbing layer.

9. A fabrication process of an X-ray mask comprising:
forming an X-ray transmissive film at least on the front surface of a substrate;
bonding said substrate on a support frame body at the peripheral portion of the back surface of said substrate;
etching the back surface of the substrate with leaving the peripheral portion un-etched;
forming an X-ray absorbing layer entirely of an oxide on said X-ray transmissive layer; and
forming an X-ray absorber by patterning said X-ray absorbing layer by way of a lithographic technology.

10. An X-ray mask fabrication process as set forth in claim 9, wherein said step of forming said X-ray absorbing layer is performed with cooling said X-ray transmissive film by contacting a gas on the back surface of said X-ray transmissive film.

11. A fabrication process of an X-ray mask as set forth in claim 9, wherein said step of forming said X-ray absorber is performed with employing a photolithography method, an electron beam drawing exposure method or a focused ion beams exposure method.

12. A fabrication process of an X-ray mask as set forth in claim 10, wherein said step of forming said X-ray absorber is performed with employing a photolithography method, an electron beam drawing exposure method or a focused ion beams exposure method.

13. A fabrication process of an X-ray mask comprising:
forming an X-ray transmissive film at least on the front surface of a substrate;
forming an X-ray absorbing layer entirely of oxide on said X-ray transmissive film;
forming an X-ray absorber by patterning said X-ray absorbing layer by way of a lithographic technology;
bonding said substrate on a support frame body at the peripheral portion of the back surface of said substrate; and
etching the back surface of said substrate with leaving the peripheral portion un-etched.

14. A fabrication process of an X-ray mask as set forth in claim 13, wherein said step of forming said X-ray absorber is performed with employing a photolithography method, an electron beam drawing exposure method or a focused ion beams exposure method.

15. A method of fabricating an X-ray mask, comprising:
forming a first X-ray transmissive film on a first surface of a substrate;
forming an X-ray absorbing layer on said X-ray transmissive film, wherein said X-ray absorbing layer is formed entirely of one of: an oxide and a nitride; and
etching said X-ray absorbing layer to form a patterned X-ray absorbing layer,
wherein forming said X-ray absorbing layer includes selecting material that includes an oxide of at least one of: Ta, W, Re, TaW alloy, WRe alloy, TaRe alloy, alloy of Ta and Ge, Si or Ti, alloy of Re and Ge, Si or Ti and alloy of W and Ge, Si or Ti.

16. A method according to claim 15, further comprising:
forming a second X-ray transmissive film on a second surface of said substrate.

17. A method according to claim 15, further comprising:
prior to forming said X-ray absorbing layer, forming a support frame by selectively etching a second surface of said substrate.

18. A method according to claim 17, wherein selectively etching the second surface of said substrate includes leaving peripheral portions of said substrate.

19. A method according to claim 18, further comprising:
bonding said support frame to a frame body using at least one of: cathode welding and epoxy.

20. A method according to claim 17, further comprising:
providing cooling gas to said X-ray transmissive film while forming said X-ray absorbing layer.

21. A method according to claim 15, further comprising:
after forming said X-ray absorbing layer, forming a support frame by selectively etching a second surface of said substrate.

22. A method according to claim 21, wherein selectively etching the second surface of said substrate includes leaving peripheral portions of said substrate.

23. A method according to claim 22, further comprising:
bonding said support frame to a frame body using at least one of: cathode welding and epoxy.

24. A method according to claim 23, further comprising:
while forming said X-ray absorbing layer, cooling said X-ray transmissive film by tightly fitting the second surface of said substrate with a wafer stage that receives heat via conduction.

25. A method according to claim 15, wherein forming said X-ray transmissive layer includes using at least one of: CVD and sputtering.

26. A method according to claim 15, wherein forming said X-ray absorbing layer includes sputtering said X-ray absorbing layer onto said X-ray transmissive layer using an inert gas.

27. A method according to claim 26, wherein said inert gas is selected from the group consisting of: Xe and Ar.

28. A method according to claim 15, wherein said X-ray absorbing layer is provided using TaO having a ratio of Ta to O of 1:1.3.

29. A method according to claim 15, wherein forming said X-ray absorbing layer includes sputtering a material containing at least one of: Ta, W, and Re with an oxidation gas that reacts with the material to form an oxide.

30. A method according to claim 15, wherein said material for said X-ray absorbing layer includes at least two oxides containing at least one of: Ta, W and Re.

31. A method according to claim 30, further comprising:
alternatively stacking said at least two oxides by sputtering said oxides onto said X-ray transmissive film using Xe.

32. A method according to claim 15, wherein etching includes using at least one of: photolithography, electron beam drawing exposure, and focused ion beam exposure.

* * * * *